(12) United States Patent
Kaiser et al.

(10) Patent No.: US 6,628,156 B2
(45) Date of Patent: Sep. 30, 2003

(54) INTEGRATED CIRCUIT HAVING A TIMING CIRCUIT, AND METHOD FOR ADJUSTMENT OF AN OUTPUT SIGNAL FROM THE TIMING CIRCUIT

(75) Inventors: Robert Kaiser, Kaufering (DE); Thilo Schaffroth, Röhrmoos (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/897,281

(22) Filed: Jul. 2, 2001

(65) Prior Publication Data

US 2002/0027462 A1 Mar. 7, 2002

(30) Foreign Application Priority Data

Jun. 30, 2000 (DE) .......................... 100 31 946

(51) Int. Cl.[7] ................................. H03L 7/00
(52) U.S. Cl. .................. 327/161; 327/162; 327/237; 375/364
(58) Field of Search ................. 327/161, 162, 327/163, 172–175, 176, 27, 37, 155, 231, 233, 236, 237; 375/359, 360, 364, 371; 365/233, 233.5

(56) References Cited

U.S. PATENT DOCUMENTS

| | | | | |
|---|---|---|---|---|
| 4,497,056 A | * | 1/1985 | Sugamori | .................. 714/700 |
| 4,514,647 A | | 4/1985 | Shoji | .......................... 327/161 |
| 4,710,704 A | * | 12/1987 | Ando | ..................... 324/103 R |
| 6,166,528 A | * | 12/2000 | Rossetti et al. | ............. 323/283 |
| 6,198,322 B1 | * | 3/2001 | Yoshimura | .................. 327/153 |

FOREIGN PATENT DOCUMENTS

| | | |
|---|---|---|
| DE | 37 33 554 A1 | 4/1988 |
| DE | 197 03 986 C2 | 12/1997 |
| DE | 198 30 260 A1 | 1/2000 |

* cited by examiner

Primary Examiner—Timothy P. Callahan
Assistant Examiner—Minh Nguyen
(74) Attorney, Agent, or Firm—Laurence A. Greenberg; Werner H. Stemer; Gregory L. Mayback

(57) ABSTRACT

An integrated circuit has a timing circuit with a power source and a capacitor. The timing circuit outputs an output signal whose time can be adjusted and which has a switching time delayed with respect to a reference time. A control signal output by a drive circuit is connected to the timing circuit for adjustment of the output signal with regard to the switching time. The output signal from the timing circuit is connected to the drive circuit for assessment of the output signal with regard to the switching time. The operation of the timing circuit can thus be adjusted independently of process fluctuations during the production of the integrated circuit.

9 Claims, 2 Drawing Sheets

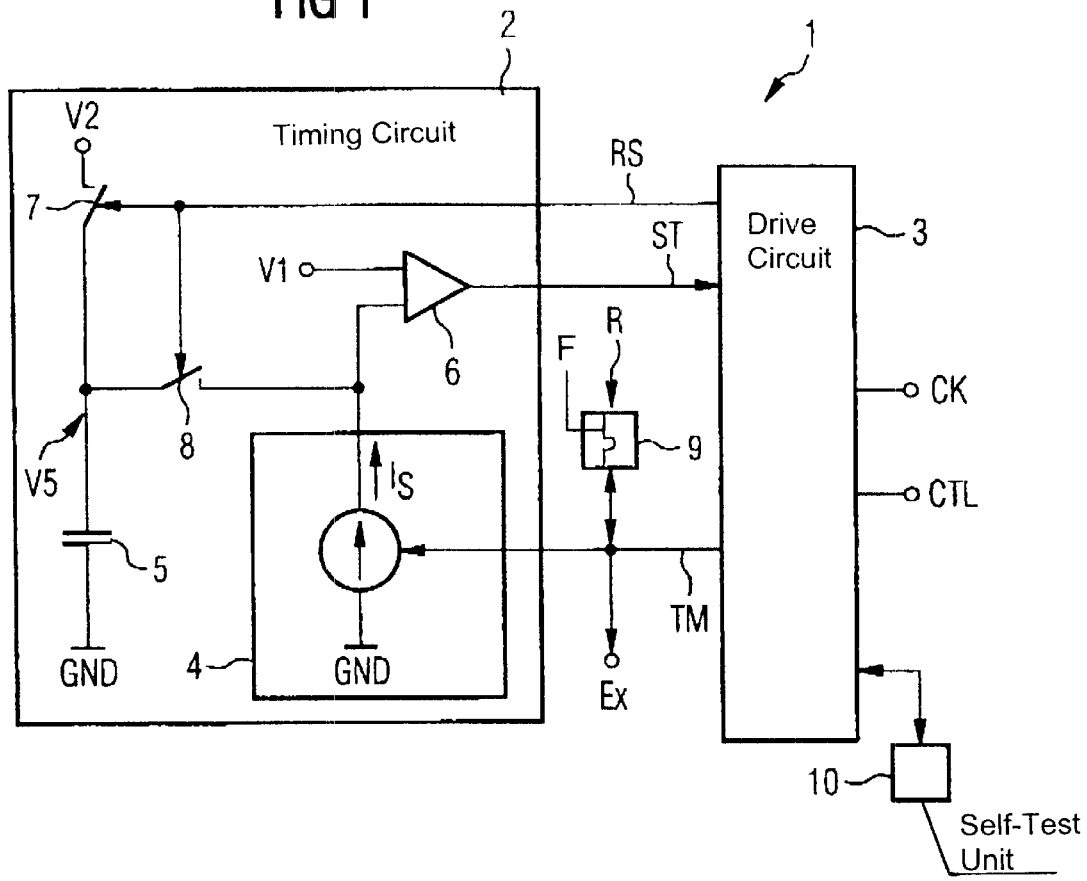
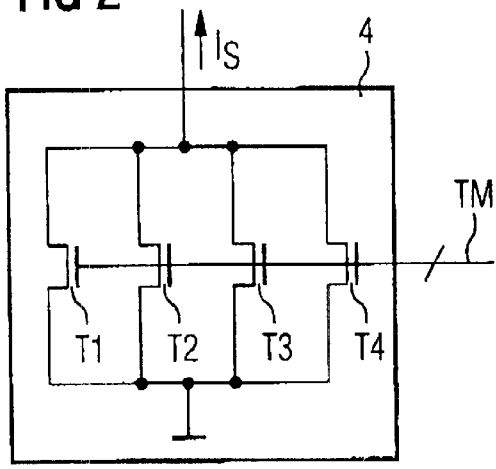

INTEGRATED CIRCUIT HAVING A TIMING CIRCUIT, AND METHOD FOR ADJUSTMENT OF AN OUTPUT SIGNAL FROM THE TIMING CIRCUIT

BACKGROUND OF THE INVENTION

Field of the Invention

The present invention relates to an integrated circuit having a timing circuit which has a connection for emitting an output signal whose time can be adjusted, and which has a switching time which is delayed with respect to a reference time, and to a method for adjustment of the output signal from the timing circuit.

Integrated circuits in which a number of digital signals are received and processed at comparatively high switching speeds require, since the specification is often very tight with regard to time, signal switching times whose timings are matched very precisely, for example between different functional groups in the integrated circuit. This can be controlled, for example, by using timing circuits or delay circuits (which are referred to as timing delay circuits), which have an output signal as a control signal which has a switching time delayed with respect to a reference time. Such timing circuits are used, for example, for what is referred to as auto-refresh for dynamic random access memory (DRAM) circuits, or for the constant precharging of differential amplifiers. In this case, it is particularly desirable for the operation of the timing circuits and their output signals to be as independent as possible of process fluctuations during the production of the integrated circuit. A largely standard method of operation and functionality of a number of timing circuits in the integrated circuit or in different integrated circuits can thus be achieved.

In order to match a timing circuit in an integrated circuit to the given requirements as well as possible and in order to make it possible to compensate for process fluctuations that occur during production, a circuit part of a timing circuit, for example a power source, is, for example, adjustable within a specific range. During the adjustment of such circuit parts, influences of the operating voltage of the integrated circuit, process fluctuations and temperature fluctuations must, in particular, be taken into account. During the course of production of the integrated circuit, the respective circuit part of a timing circuit can be set, and hence matched, on its own. This is done, for example, by varying a reference value in a suitable manner so as to compensate, for example, for the influence of process fluctuations in a specific manner.

Such an indirect adjustment process for the switching time of the output signal from a timing circuit, which is also referred to as trimming, and is normally carried out by an external test set, is generally difficult and is subject to inaccuracies. Normally, this involves a relatively high level of instrumentation complexity. Furthermore, such an adjustment process can normally not be carried out via external connections for all the envisaged timing circuits in the integrated circuit.

SUMMARY OF THE INVENTION

It is accordingly an object of the invention to provide an integrated circuit having a timing circuit, and a method for adjustment of an output signal from the timing circuit which overcome the above-mentioned disadvantages of the prior art devices and methods of this general type, in which the method of operation and the functionality of the timing circuit can be adjusted as independently as possible of process fluctuations and other production-dependent influences.

With the foregoing and other objects in view there is provided, in accordance with the invention, an integrated circuit. The integrated circuit contains a timing circuit having a connection for emitting an output signal whose time can be adjusted and the output signal has a switching time which is delayed with respect to a reference time. A drive circuit is connected to the timing circuit for assessing and adjusting the output signal from the timing circuit with regard to the switching time. The drive circuit has a connection connected to the timing circuit for outputting a control signal for adjusting the output signal with regard to the switching time. The timing circuit has an adjustable power source connected to the connection for the control signal. The timing circuit has a capacitance connected to and able to be charged and discharged through the adjustable power source. The output signal from the timing circuit is adjustable on a basis of a potential applied to the capacitance. The connection for the output signal of the timing circuit is connected to the drive circuit for assessing the output signal with regard to the switching time and with respect to the reference time.

Thus, according to the invention, the output signal from the timing circuit can be adjusted by the drive circuit such that the switching time of the output signal has a desired time delay with respect to a reference time. This allows the switching time to be influenced directly. The method of operation and functionality of the timing circuit can thus be adjusted largely independently of process fluctuations and other production-dependent influences.

This furthermore makes relatively simple handling and measurement possible, since the measurement, assessment and adjustment of the switching time of the output signal from the timing circuit can be carried out by the drive circuit. In consequence, no external test equipment is required. Since, when carrying out such a measurement, the corresponding switching flanks need not be measured or analyzed directly by an external test system, this results in higher measurement accuracy. Since the measurement is carried out directly on the chip of the integrated circuit, the measurement accuracy is not constrained by a tolerance of the external test system or of the entire test configuration.

In principle, the method can be used with a number of types of timing circuits that have an output signal whose time can be adjusted. The timing circuit has an adjustable power source which is connected to the connection for the control signal for the drive circuit, and a capacitance which can be charged or discharged through the power source. The switching time of the output signal is thus adjusted by suitable adjustment of the power source. In this case, the power source is adjusted in such a manner that the output signal has the desired switching time.

Adjustment can be carried out on the basis of a potential that is applied to the capacitance. The potential on the capacitance is in this case variable and depends on the current from the power source. For example, the capacitance is discharged from a charged state through the power source, so that the potential on the capacitance falls. It is likewise possible for the capacitance to be charged from the power source, so that the potential that is applied to the capacitance rises. The switching time of the output signal from the timing circuit can be derived from the potential profile on the capacitance.

In one development of the invention, the timing circuit has a comparison circuit for comparison of a reference potential with the potential that is applied to the capacitance. One output of the comparison circuit is in this case connected to the connection for the output signal from the timing circuit. If, for example, the capacitance is discharged through the power source, then the potential that is applied to the capacitance falls from an initial charge potential. If the value falls below the value of the reference potential in this process, then a corresponding signal is produced at the output of the comparison circuit. The signal has, for example, a switching flank from a low potential level to a high potential level. The switching flank in this case occurs at a time in which the potential that is applied to the capacitance is below the reference potential. The signal produced by the comparison circuit may be used as the output signal from the timing circuit.

During normal operation, for example, the timing circuit is used as what is referred to as a timing delay circuit. The timing circuit can be used, for example, to control the timing of what is referred to as autorefresh for a DRAM memory. However, it is also possible to use the timing circuit as a measurement circuit or as a reference circuit for other timing circuits on the chip of the integrated circuit. The timing circuit which is used as a measurement circuit is advantageously provided in an area of the chip which is not required for other functional groups of the chip.

In this case, the integrated circuit according to the invention has further timing circuits, each having a capacitance which can be charged or discharged. Furthermore, each of the further timing circuits has a connection which is connected via at least one current mirror circuit to the power source of the timing circuit. In consequence, the further timing circuits do not require their own adjustable power source. The timing circuit according to the invention is adjusted by suitable adjustment of its power source in the desired manner. The current which is sent via the power source is reflected onto the other timing circuits, so that they are likewise adjusted without any need to carry out an adjustment process on them themselves. The current from the power source can thus be distributed in a suitable manner over the semiconductor chip, and supplied to the respective time circuits.

If the timing circuit according to the invention is used as a measurement circuit, then its capacitance is preferably configured such that it reflects the relevant types of (parasitic) capacitances in the other timing circuits, for example gate capacitances, line capacitances and so on. The use of parasitic capacitances in the other timing circuits advantageously results in that there is no need to provide specific capacitances there.

In one advantageous refinement of the integrated circuit according to the invention, the output signal from the timing circuit can be adjusted by the drive circuit on the basis of a reference value. The integrated circuit then preferably has a memory unit for storing the reference value. In consequence, the reference value need be set only once, for example during a test mode, and is stored in the memory unit during normal operation. The memory unit then, for example, has programmable elements in the form of what are referred to as laser fuses or electrically programmable fuses. The laser fuses are programmed by what is referred to as a laser cutter in order to adjust and/or store the reference value.

In one development of the invention, the integrated circuit has a self-test unit, by which respectively following states of the output signal from the timing circuit can be analyzed. The self-test unit is also used for step-by-step adjustment of the output signal from the timing circuit by the drive circuit, on the basis of an analysis result. In consequence, the self-test unit allows completely autonomous trimming of the timing circuit. The self test unit is in this case based on the principle of a "Built-In-" (BIST). The test time for a number of timing circuits to be tested can in this way be considerably reduced. A number of drive circuits can be trimmed in parallel.

With the foregoing and other objects in view there is provided, in accordance with the invention, a method for adjusting an output signal from a timing circuit of an integrated circuit. The method includes the steps of:

initializing the timing circuit at a start of an adjustment process by a drive circuit connected to the timing circuit;

subsequently measuring the output signal and assessing the output signal with regard to a switching time of the output signal;

and adjusting the output signal on a basis of an assessment with regard to the switching time by a control signal output from the drive circuit and received by the timing circuit.

The timing circuit can be trimmed in various ways, depending on the required measurement accuracy. In one refinement of the method according to the invention, the drive circuit is connected to a connection for a clock signal. The output signal from the timing circuit is assessed by the drive circuit on the basis of the clock signal, by determining a number of clock periods before the occurrence of the switching time. The number of clock periods can then be assessed, for example using a value table, with a suitable reference value for adjustment of the power source being derived from this.

In another refinement of the method according to the invention, the output signal from the timing circuit is assessed by the drive circuit on the basis of the clock signal by determining whether the switching time of the output signal has occurred by the end of a clock period. If, for example, the switching time has not occurred within the clock period, then the reference value for controlling the power source is changed, so that the current from the power source is, for example, increased. This step is repeated until the switching time occurs within a clock period. The current from the power source can then be reduced in a next step to allow the switching time of the output signal to be accurately adjusted iteratively.

Other features which are considered as characteristic for the invention are set forth in the appended claims.

Although the invention is illustrated and described herein as embodied in an integrated circuit having a timing circuit, and a method for adjustment of an output signal from the timing circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a circuit diagram of one embodiment of an integrated circuit according to the invention;

FIG. 2 is a circuit diagram of one embodiment of a power source for the integrated circuit shown in FIG. 1;

DESCRIPTION OF THE PREFERRED EMBODIMENTS

Figure 3:
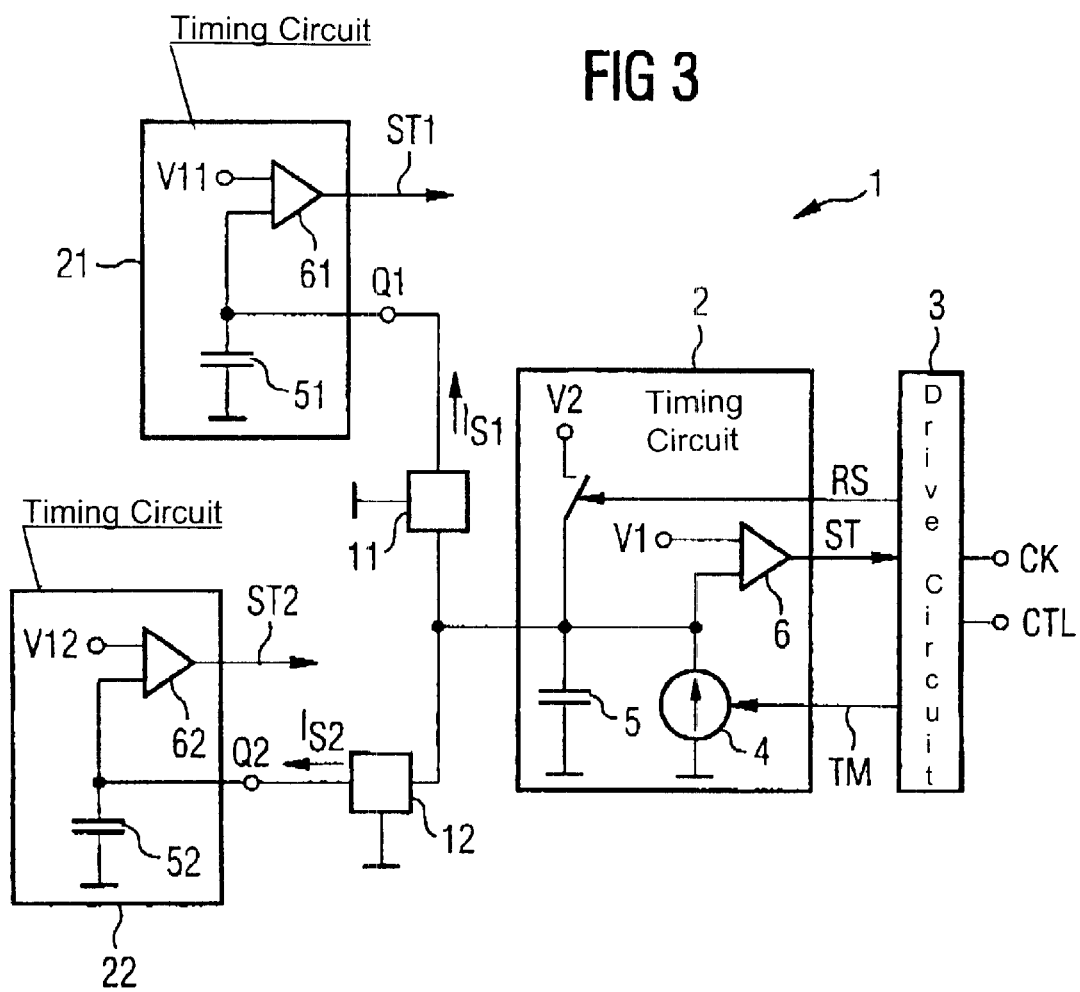
FIG. 3 is a circuit diagram of a further embodiment of the integrated circuit according to the invention.

In all the figures of the drawing, sub-features and integral parts that correspond to one another bear the same reference symbol in each case. Referring now to the figures of the drawing in detail and first, particularly, to FIG. 1 thereof, there is shown one embodiment of an integrated circuit 1 according to the invention, which has a timing circuit 2 and a drive circuit 3. The timing circuit 2 has a connection for emitting an output signal ST whose time can be adjusted and which has a switching time whose time can be adjusted. The timing circuit 2 furthermore has a power source 4 that is connected to a capacitance 5 via a switch 8. The power source 4 and the capacitance 5 are connected by a respective second connection to a reference-ground potential GND of the integrated circuit 1. The timing circuit 2 also has a comparison circuit in the form of a differential amplifier 6 for comparing a reference potential V1 with a potential V5 which is applied to the capacitance 5. The capacitance 5 can be charged to a potential V2 via a switch 7.

The drive circuit 3 has a connection for a control signal TM, and this connection is connected to the timing circuit 2, in particular to the controllable power source 4. The drive circuit 3 is also connected via a signal RS to the timing circuit 2, which controls the switches 7 and 8 for the timing circuit 2. The drive circuit 3 is also connected to a clock signal CK and to a control signal CTL.

The power source 4 can be adjusted by the signal TM. In this case, the magnitude of a current IS produced by the power source 4 can be varied. FIG. 2 shows one embodiment of the power source 4. The power source 4 has a number of parallel-connected NMOS transistors T1 to T4. The signal TM allows the transistors T1 to T4 to be switched on individually. The magnitude of the current IS can be varied depending on the number of parallel-connected transistors T1 to T4. In this case, it is once again possible for the power source 4 to be configured using PMOS transistors or switchable resistors.

The potentials V1 and V2 in FIG. 1 may, for example, be external reference potentials, or are produced and adjusted on the chip on which the integrated circuit 1 is located. The magnitude of the capacitance 5 to be provided is dependent, in particular, on the magnitude of the current IS from the current source 4 and on the accuracy required of the timing circuit 2.

One embodiment of a method according to the invention for adjustment of the output signal ST from the timing circuit 2 will be explained in more detail in the following text with reference to FIG. 1 in conjunction with FIG. 4.

At the start of an adjustment process, the timing circuit 2 is initialized by the drive circuit 3. The start is for this purpose indicated, for example, by the external control signal CTL. The signal RS from the drive circuit 3 is used to close the switch 7, and to initially charge the capacitance 5 to the potential V2. This is done by waiting through a number of clock periods of the external clock signal CK, in order to initially charge the capacitance 5 completely to the potential V2. After this, the switch 7 is opened once again by the signal RS. The switch 8 is closed at the time t0, and the capacitance 5 is discharged through the power source 4. As shown in FIG. 4, this assumes that the potential V5 on the capacitance 5 decreases linearly. As soon as the potential V5 becomes less than the value of the reference potential V1, this is identified by the differential amplifier 6, and an appropriate output signal ST is produced at the time t1. The switching time t1 of the signal ST is delayed with respect to the reference time t0.

Figure 4:
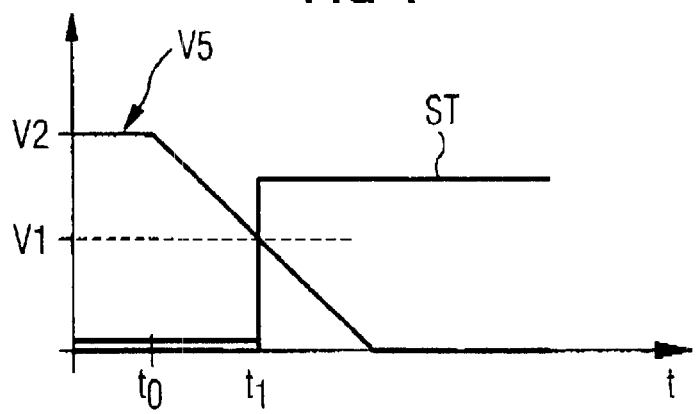
FIG. 4 is a graph showing a timing diagram for the integrated circuit shown in FIG. 1.

The gradient of the profile of the potential V5 as shown in FIG. 4 can be varied by varying the magnitude of the current IS from the power source 4. For example, reducing the current IS makes the profile of the potential V5 flatter, thus further delaying the time t1. The signal ST then has a later switching time t1.

Thus, once the initialization of the timing circuit 2 has been completed and the capacitance 5 has been initially charged, the process of discharging the capacitance 5 is initiated, and a switching time t1 of the output signal ST from the timing circuit 2 is measured, and is assessed with reference to a reference time t0. The measurement and the assessment are in this case carried out by the drive circuit 3. The control signal TM is produced as a result of the assessment, and is used to adjust the current IS from the power source 4, and hence to adjust the switching time t1 of the output signal ST. The signal TM may in this case represent a reference value R, which can be stored in a memory unit 9. The memory unit 9 has, for example, electrically programmable fuses F, which permanently store the reference value R. It is likewise possible for the signal TM to be read via the external connection EX and then to be stored permanently in the memory unit 9, for example by using a laser beam to program the laser fuses. The memory unit 9 may also have volatile memory elements, in the form of latches, for temporary storage of a reference value R.

The output signal ST from the timing circuit 2 can be assessed on the basis of the clock signal CK. In a first embodiment, the number of clock periods of the clock signal CK before the occurrence of the switching time t1 is determined. In the situation where the number of clock periods is less than or greater than a predetermined value, the process can continue in various ways. First, the correct value of the current IS can be determined on the basis of the specific number of clock periods by using a value table, for example. In another embodiment, an iterative process can be initiated, in which the current IS is increased or reduced in steps until the predetermined number of clock periods is reached. The relative accuracy of the measurement is in this case given by $$\frac{\delta t}{t} = \frac{TCK}{N*TCK} \quad \text{where}$$

$$N*TCK = \frac{(V2-V1)C5}{IS}$$

In this case, TCK is the period duration of one clock period of the clock signal CK. The absolute time test accuracy of the drive circuit 3 is in this case negligible in comparison to the relatively high clock frequency of the clock signal CK. The clock signal CK is applied, for example, from an external test set which has a maximum frequency of, for example, 50 MHz. This results in a relative accuracy of $\delta t/t<1\%$ for a current IS=1$\mu$A, a voltage difference V2−V1= 1V and the capacitor 5 having a capacitance of C5=1 pF.

In a further embodiment of the method, the output signal ST from the timing circuit 2 is assessed on the basis of the clock signal CK, by determining whether the switching time t1 has occurred by the end of one clock period. In the situation where the switching time t1 has not occurred, the current IS from the power source 4 is increased appropriately. In the converse situation, in which the switching time t1 has occurred, the current IS from the power source 4 is reduced appropriately. This iterative procedure is repeated until the predetermined value of the time t1 has been set. For this exemplary embodiment, this results in a relative accuracy of:

$$\frac{\delta t}{\Delta} \text{ where}$$

$$\Delta = \frac{(V2 - V1)C5}{IS}$$

where δt represents the absolute time test accuracy of the drive circuit 3 and/or of the clock signal.

The circuitry configuration of the drive circuit 3 can be simplified appropriately for the situation where the signal CTL contains a number of commands which are required for initialization, resetting and assessment of the signal ST.

In one development, the integrated circuit 1 as shown in FIG. 1 has a self test unit 10, which allows analysis of the respectively successive states of the output signal ST from the timing circuit 2. The self test unit 10 is part of the drive circuit 3 or, as shown in FIG. 1, is connected to the drive circuit 3. The self test unit 10 is also used for step-by-step adjustment of the output signal ST from the timing circuit 2 by the drive circuit 3 and on the basis of the analysis result. The self test unit 10 allows the timing circuit 2 to be trimmed autonomously, without any external test equipment.

FIG. 3 shows an expanded embodiment of the integrated circuit 1 according to the invention. The integrated circuit 1 has a number of timing circuits 21 and 22, which in this case each have a capacitance 51 and 52, which can be charged or discharged. Connections Q1 and Q2 are connected to the power source 4 via a respective current mirror circuit 11 or 12.

The timing circuits 21 and 22 themselves have connections at which output signals ST1 and ST2 can be tapped off. The output signals ST1 and ST2 can likewise be adjusted in time and, with respect to a respective reference time, each have delayed switching times, which may be different, also with respect to the signal ST. The respective switching times can in this case be adjusted via comparison circuits 61 and 62, which compare the potentials which are applied to the capacitances 51 and 52 with respect to reference potentials V11 and V12. The capacitances 51 and 52 are in this case charged or discharged by respective currents IS1 and IS2. The currents IS1 and IS2 are in this case derived from the current IS from the power source 4 via the respective current mirror circuits 11 and 12.

It is thus possible to use the drive circuit 3 not only to adjust the switching times of the output signal from the timing circuit 2, but also to adjust the switching times of the output signals from the other timing circuits 21 and 22. This advantageously allows both the measurement and control complexity and the space required to be kept comparatively low. The timing circuit 2 may, for example, be in the form of a measurement circuit, which is located together with the drive circuit 3 at a suitable point on the integrated circuit 1. The current mirror circuits allow the current IS produced from the current source 4 to be distributed at the required level over the integrated circuit 1.

In this context, it is possible to use, for example, an external test set to measure and to assess the output signals ST1 and ST2. On the basis of the assessment, the power source 4 can be adjusted via a signal TTL and/or via the drive circuit 3. A predetermined value of the switching times for the signals ST1 and ST2 can be transmitted in a corresponding manner 2, and can be converted in, the timing circuit 2. The timing circuit 2 is adjusted in a suitable manner, as described above, by appropriate adjustment of the signal ST for the timing circuit 2. The timing circuits 21 and 22 are thus also adjusted in a corresponding manner. However, this indirect adjustment of the switching times of the signals ST and ST2 correspondingly reduces the accuracy of adjustment in comparison to the embodiments described above.

Thus, in this exemplary embodiment, the timing circuit 2 is used as a reference circuit and measurement circuit for adjustment of the signals ST1 and ST2. This is particularly advantageous when no further space is available to provide a drive circuit 3 at those points on the integrated circuit 1 at which the timing circuits 21 and 22 are located. The timing circuits 21 and 22 may generally be any desired delay circuits which have capacitances which can be charged or discharged, for example in the form of parasitic capacitances such as gate capacitances or wire capacitances.

We claim:

1. An integrated circuit for generating a timing signal, comprising:
   a timing circuit having an output terminal for generating the timing signal, the timing signal being delayed with respect to a reference time by a delay time and said delay time is adjustable, said timing circuit including an adjustable power source and a capacitor connected to said adjustable power source;
   a drive circuit having an input terminal connected to said output terminal of said timing circuit for receiving the timing signal; and
   a memory unit connected to said drive circuit for storing a reference value;
   wherein said drive circuit generates a control signal for controlling said adjustable power source in said timing circuit for adjusting said delay time of the timing signal with respect to said reference time based on an assessment of the timing signal provided by said timing circuit and said reference value provided by said memory unit;
   wherein said delay time of the timing signal with respect to said reference time is adjusted on a basis of a potential applied to said capacitor by said adjustable power source which is controlled by said control signal.

2. The integrated circuit according to claim 1, wherein said timing circuit further comprises a comparison circuit for comparison of a reference potential with the potential applied to said capacitor, said comparison circuit having an output connected to said output terminal of said timing circuit.

3. The integrated circuit according to claim 1, including:
   a current mirror circuit connected to said timing circuit; and
   a further timing circuit having a further capacitor able to be charged and discharged and connected to said current mirror circuit, said further timing circuit having a connection connected to said adjustable power source through said current mirror circuit.

4. The integrated circuit according to claim 1, wherein said memory unit comprises programmable elements selected from a group consisting of laser fuses and electrically programmable fuses.

5. The integrated circuit according to claim 1, including a test unit connected to said drive circuit for analyzing respectively successive states of the timing signal generated by said timing circuit and for step-by-step adjustment of the timing signal by said drive circuit on a basis of an analysis result.

6. The integrated circuit according to claim 1, including:
   current mirror circuit connected to said timing circuit; and
   further timing circuits each having a further capacitor able to be charged and discharged and connected to a respective one of said current mirror circuits, each of said further timing circuits having a connection connected to said adjustable power source through said respective one of said current mirror circuits.

7. A method for adjusting a timing signal from a timing circuit of an integrated circuit, which comprises the steps of:
   initializing the timing circuit at a start of an adjustment process by a drive circuit connected to the timing circuit;
   subsequently measuring the timing signal and assessing the timing signal with regard to a delay time of the timing signal;
   storing a reference value in a memory unit and adjusting the timing signal by the drive circuit on a basis of the reference value; and
   adjusting the timing signal on a basis of an assessment with regard to the delay time by a control signal output from the drive circuit and received by the timing circuit.

8. The method according to claim 7, which further comprises:
   transmitting a clock signal to a clock signal input of the drive circuit; and
   assessing the timing signal in the drive circuit on a basis of the clock signal by determining a number of clock periods before an occurrence of the delay time.

9. The method according to claim 7, which further comprises:
   transmitting a clock signal to a clock signal input of the drive circuit; and
   assessing the timing signal in the drive circuit on a basis of the clock signal by determining if the delay time has occurred by at an end of a clock period.

\* \* \* \* \*